(12) United States Patent
Campbell et al.

(10) Patent No.: US 7,903,411 B2
(45) Date of Patent: Mar. 8, 2011

(54) COLD PLATE STABILITY

(75) Inventors: Levi A. Campbell, Poughkeepsie, NY (US); John L. Colbert, Byron, MN (US); Michael J. Ellsworth, Jr., Lagrangeville, NY (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 12/185,141

(22) Filed: Aug. 4, 2008

(65) Prior Publication Data

US 2008/0308260 A1 Dec. 18, 2008

Related U.S. Application Data

(63) Continuation of application No. 11/741,852, filed on Apr. 30, 2007, now Pat. No. 7,499,279.

(51) Int. Cl.
*H05K 7/20* (2006.01)

(52) U.S. Cl. ........ 361/704; 361/699; 361/702; 165/80.3; 165/80.4; 257/714; 257/718

(58) Field of Classification Search ................... None
See application file for complete search history.

(56) References Cited

U.S. PATENT DOCUMENTS

| | | | |
|---|---|---|---|
| 4,235,285 A | 11/1980 | Johnson et al. | |
| 5,036,384 A | 7/1991 | Umezawa | |
| 5,099,311 A | 3/1992 | Bonde et al. | |
| 5,170,319 A | 12/1992 | Chao-Fan Chu et al. | |
| 5,983,997 A * | 11/1999 | Hou | 165/144 |
| 6,058,014 A | 5/2000 | Choudhury et al. | |
| 6,116,331 A | 9/2000 | Tustaniwskyj et al. | |
| 6,198,630 B1 | 3/2001 | Cromwell | |
| 6,475,011 B1 * | 11/2002 | Sinha et al. | 439/330 |
| 6,679,315 B2 | 1/2004 | Cosley et al. | |
| 6,724,629 B1 * | 4/2004 | Augustin et al. | 361/704 |
| 6,930,884 B2 | 8/2005 | Cromwell et al. | |
| 6,992,382 B2 | 1/2006 | Chrysler et al. | |
| 7,009,843 B2 | 3/2006 | Lee et al. | |
| 7,044,196 B2 * | 5/2006 | Shook et al. | 165/80.3 |
| 7,149,087 B2 | 12/2006 | Wilson et al. | |
| 7,190,586 B2 * | 3/2007 | Franz et al. | 361/704 |
| 7,193,854 B2 | 3/2007 | Bonomo et al. | |
| 7,272,006 B2 | 9/2007 | Mongia et al. | |
| 7,285,851 B1 | 10/2007 | Cepeda-Rizo et al. | |
| 7,375,963 B2 * | 5/2008 | Eckberg et al. | 361/704 |
| 7,414,844 B2 * | 8/2008 | Wilson et al. | 361/699 |
| 7,435,623 B2 * | 10/2008 | Chrysler et al. | 438/122 |
| 7,520,761 B2 * | 4/2009 | Weiss | 439/91 |
| 7,570,490 B2 * | 8/2009 | Refai-Ahmed et al. | 361/719 |
| 2006/0226539 A1 | 10/2006 | Chang et al. | |
| 2008/0024991 A1 * | 1/2008 | Colbert et al. | 361/704 |

* cited by examiner

*Primary Examiner* — Boris L Chervinsky
(74) *Attorney, Agent, or Firm* — Cantor Colburn LLP

(57) ABSTRACT

A cold plate assembly includes a cold plate with at least two plumbing ports. The cold plate assembly further includes a spring plate assembly, which applies an actuation load to the cold plate. The spring plate assembly includes a spring plate and a spring pin moveable in a slot of the spring plate assembly to maintain the actuation load. The actuation load is configured to mechanically actuate the cold plate to a module.

10 Claims, 7 Drawing Sheets

COLD PLATE STABILITY

CROSS REFERENCE TO RELATED APPLICATIONS

This application is a continuation of U.S. patent application Ser. No. 11/741,852 filed Apr. 30, 2007, the contents of which are incorporated by reference herein in their entirety.

BACKGROUND

The present disclosure relates generally to integrated circuit heat dissipation devices, and, in particular, to methods and apparatuses for cold plate stability.

As high performance computers increase in performance, which may be measured in floating-point operations per second (FLOPS) or millions of instructions per second (MIPS), the associated microprocessors within the computers typically increase in both speed and required electrical power. As manufacturers have sought to integrate multiple microprocessors or other components within a single package, such as a multi-chip module (MCM) or other multi-core technologies, the associated number of electrical connections for such packages has grown. In order to reduce package size, many manufacturers have turned from pin grid array (PGA) and ball grid array (BGA) interfaces to land grid array (LGA) interfaces. An LGA interface may use pads instead of pins or balls to connect to a printed wire board (PWB) through a socket or similar interface. LGAs may be preferred over PGAs or BGAs due to larger contact points and higher connection densities, allowing for higher clock frequencies and more power contacts. However, since power consumed is dissipated as heat, LGAs may produce more heat than PGAs and BGAs of comparable size. With the combined challenges of more numerous and powerful microprocessors in a given package, limits of air-cooling may be exceeded as performance demands continue to increase. Moreover, traditional cold plate assemblies may not meet mechanical constraints of modern packages, particularly in a server environment where multiple packages may be installed in a physically confined space.

Since it is desirable for performance and reliability to maintain a module's active metallurgy at a specified temperature, advanced heat transfer structures and methods are needed to maintain both thermal and structural stability.

SUMMARY

Embodiments of the invention include a cold plate assembly. The cold plate assembly includes a cold plate with at least two plumbing ports. The cold plate assembly further includes a spring plate assembly, which applies an actuation load to the cold plate. The spring plate assembly includes a spring plate and a spring pin moveable in a slot of the spring plate assembly to maintain the actuation load. The actuation load is configured to mechanically actuate the cold plate to a module.

Additional embodiments include a cold plate assembly that includes a cold plate with at least two plumbing ports and a spring plate assembly, which applies an actuation load to the cold plate. The cold plate includes a top component coupled to a bottom component and cooling fins brazed to at least one of the top component and the bottom component. The cooling fins provide a cooling fluid circulation path between the plumbing ports. The spring plate assembly includes at least one spring plate, at least one spring pin, and an actuation screw, the actuation screw adjustable to set the actuation load. The cold plate assembly further includes at least one load arm, which locks the spring plate assembly onto the cold plate via the at least one spring pin of the spring plate assembly and maintains the actuation load.

Other apparatuses, and/or systems according to embodiments will be or become apparent to one with skill in the art upon review of the following drawings and detailed description. It is intended that all such additional apparatuses and/or systems be included within this description, be within the scope of the present invention, and be protected by the accompanying claims.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Disclosed herein are apparatuses and methods for cold plate stability. While there are a wide variety of electronic packaging and interface options, such as pin grid array (PGA), ball grid array (BGA), land grid array (LGA), and hybrid LGA, a common issue exists in removing heat dissipated from modules utilizing these technologies. Greater module size, module density, and clock frequencies typically result in a greater production of heat. As a single module can contain multiple components, such as a multi-chip module (MCM) or multi-core module of microprocessors, memory, and the like, the heat dissipated from such a module can be substantial. Moreover, an LGA module (interfacing via pad connections) or a hybrid LGA module (interfacing via pad and solder connections) may require a large actuation load (e.g., about 60 grams per electrical connection point) to maintain electrical continuity between the module and a printed wire board (PWB) through which the module interfaces to other system components. In exemplary embodiments, the cold plate assembly disclosed herein provides both cooling and an actuation load for a variety of module designs, such as an LGA or hybrid LGA module, through an enhanced stability structure that supports fluid cooling and interconnections to additional cold plate assemblies.

Figure 1:
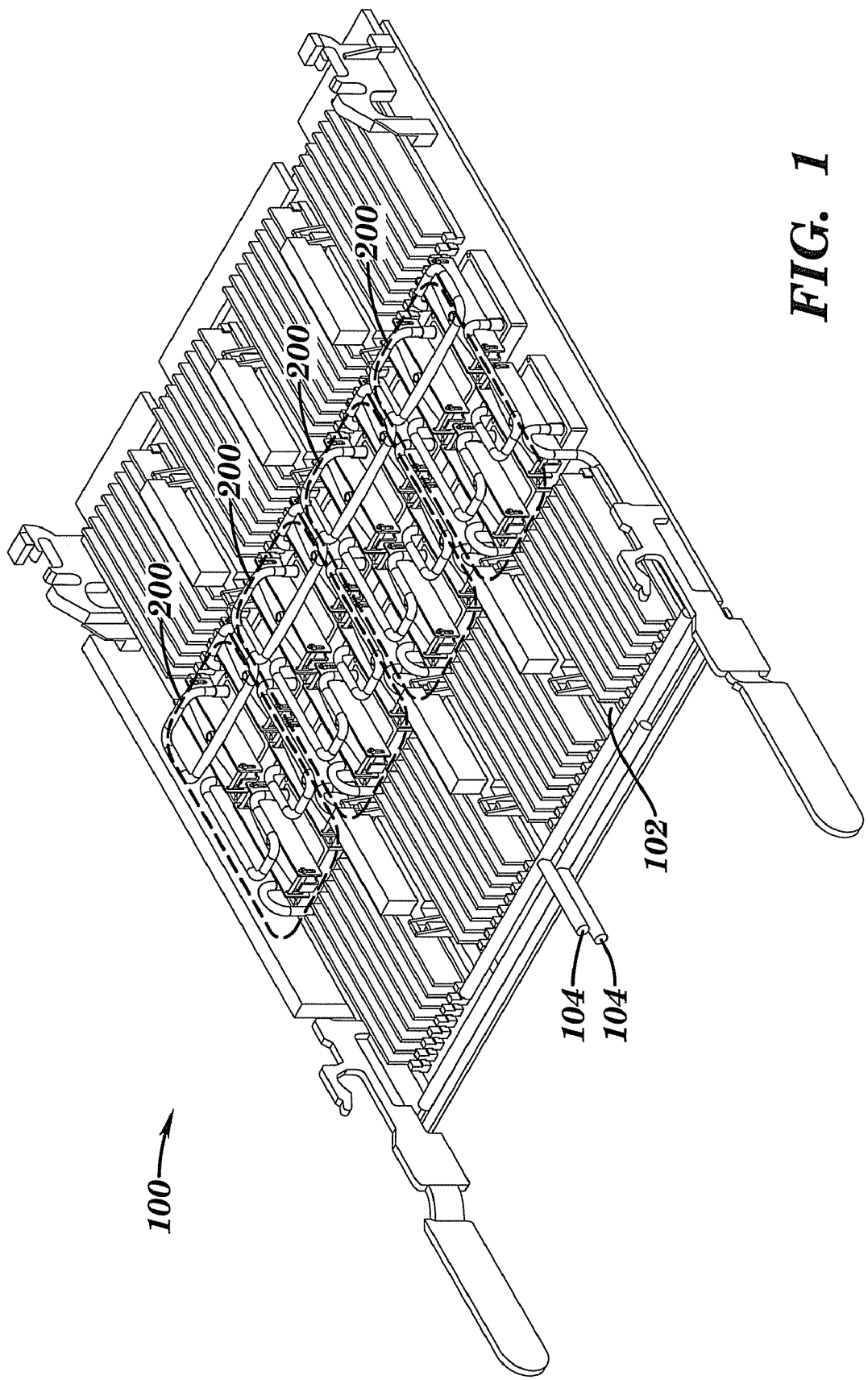
FIG. 1 is a perspective view of a node with multiple quadrants of cold plate assemblies that are plumbed together in accordance with exemplary embodiments.

Turning now to FIG. 1, a perspective view of a node 100 with multiple quadrants of cold plate assemblies 200 that are plumbed together is depicted in accordance with exemplary embodiments. In exemplary embodiments, the node 100 is a processing assembly including processing system components such as memory modules, busses, and microprocessor modules affixed to a printed wire board (PWB) 102. The node 100 may be a subsystem of a larger system such as a mainframe computer. In exemplary embodiments, the PWB 102 supports coupling modules, such as hybrid LGA modules, to the PWB 102. The PWB 102 may support multiple or mixed packaging and interfacing technologies. The node 100 may include multiple quadrants of cold plate assemblies 200 for cooling multiple modules. In exemplary embodiments, plumbing lines 104 route a cooling fluid, such as water, through each of the quadrants of cold plate assemblies 200, providing a cooling fluid circulation path though the node 100. While the configuration of cold plate assemblies depicted in FIG. 1 includes four quadrants of cold plate assemblies 200, the scope of the invention is not so limited. To the contrary, there may be any number of quadrants of cold plate assemblies 200, or alternate plumbing schemes between cold plate assemblies. Moreover, any number of cold plate assemblies may be used, including a single cold plate assembly.

Figure 2:
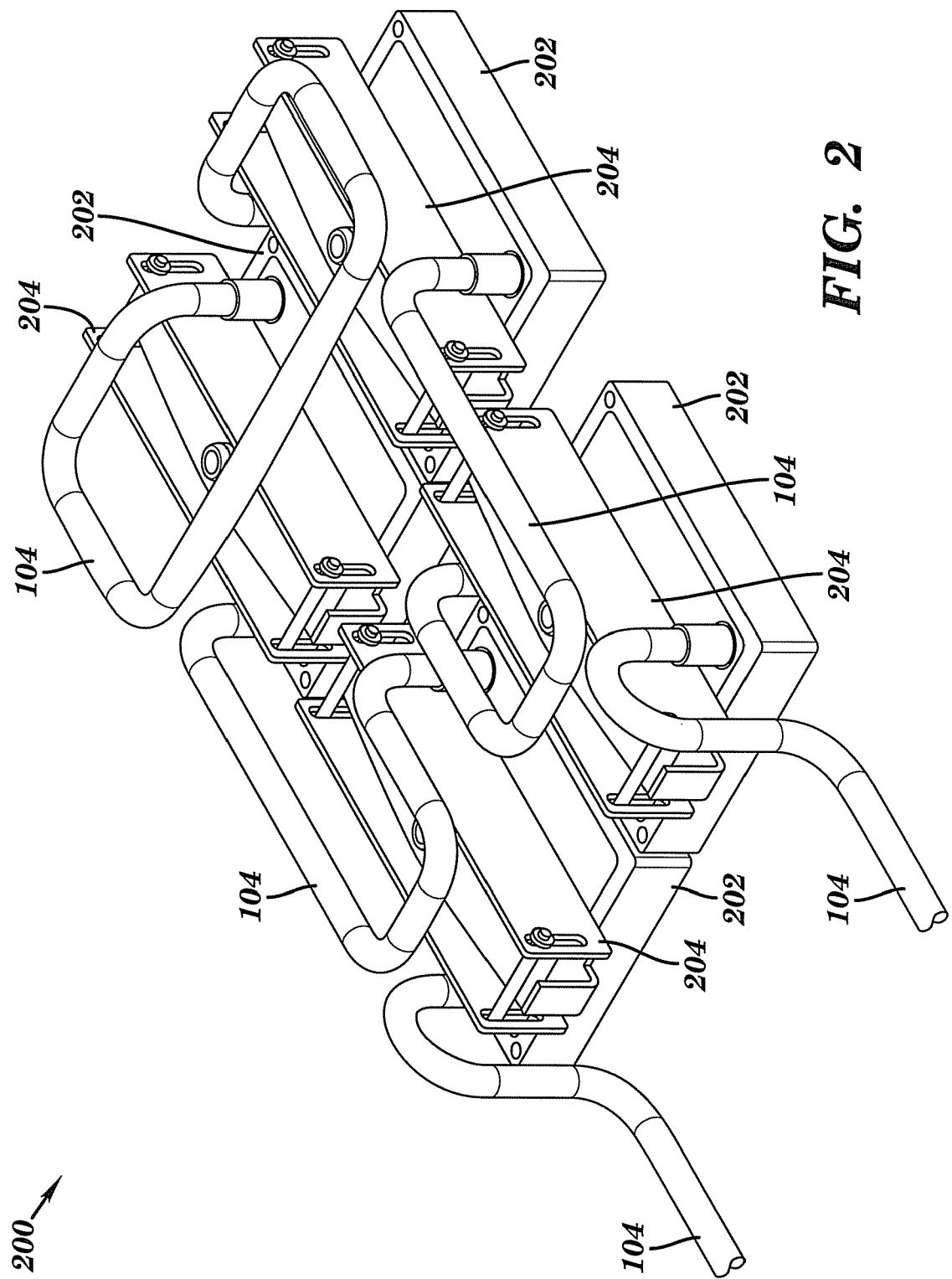
FIG. 2 is a perspective view of a quadrant of cold plate assemblies that are plumbed together in accordance with exemplary embodiments.

Turning now to FIG. 2, a perspective view of a quadrant of cold plate assemblies 200 that are plumbed together in accordance with exemplary embodiments is depicted. The quadrant of cold plate assemblies 200 includes four cold plates 202 interconnected via plumbing lines 104. A spring plate assembly 204 is depicted atop each of the cold plates 202. It will be understood by one skilled in the art that while one plumbing configuration is depicted in FIG. 2, many other configurations are possible to source and return a cooling fluid to each of the cold plates 202. In exemplary embodiments, the plumbing lines 104 are made primarily of noncompliant (e.g., low flexibility) tubing to create a robust structure that can be brazed together between the cold plates 202 to reduce the possibility of leaks. Plumbing the cold plates 202 together may facilitate cooling of multiple modules in a substantially planar fashion. Further details of the cold plates 202 and the spring plate assemblies 204 are provided herein.

Figure 3A:
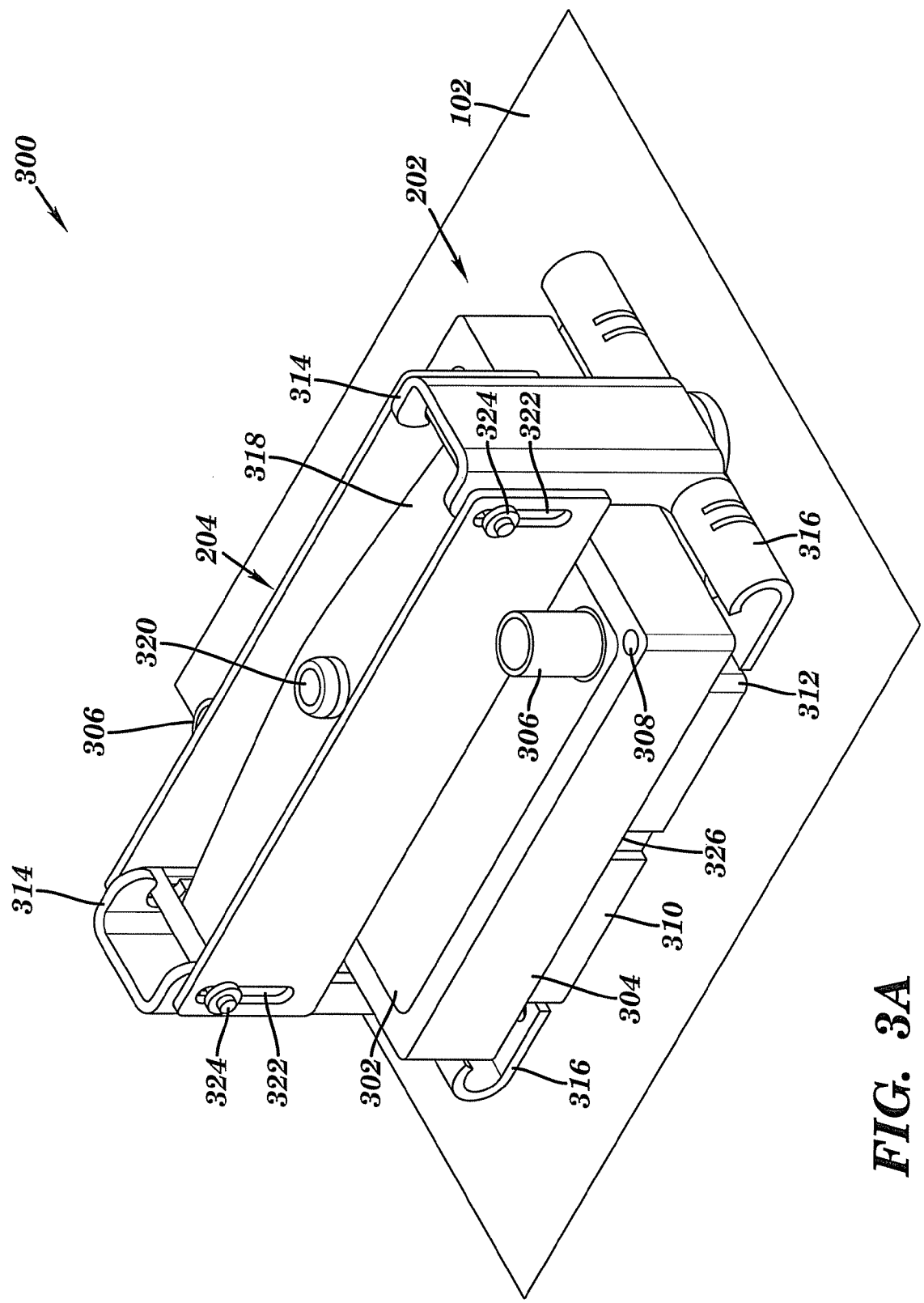
FIG. 3*a* is a perspective view of a cold plate assembly with load arms and a module subject to cooling in accordance with exemplary embodiments.

Turning now to FIG. 3a, a perspective view of a cold plate assembly 300 is depicted in accordance with exemplary embodiments. In exemplary embodiments, the cold plate assembly 300 includes a cold plate 202 and a spring plate assembly 204. The cold plate 202 includes a top component 302 and a bottom component 304. A cooling fluid circulation path, described in greater detail herein, may run internally through the cold plate 202 between plumbing ports 306. In exemplary embodiments, the two plumbing ports 306 are located at diagonally opposing corners of the top component 302 of the cold plate 202, providing inlet and outlet points for a cooling fluid to circulated through the cold plate 202. While two plumbing ports 306 are depicted on the cold plate 202, multiple plumbing ports 306 may be included in the cold plate 202 (e.g., multiple zones), providing inlet and outlet points on any surface of the cold plate 202. Moreover, the plumbing ports 306 may be located at any position relative to each other, e.g., adjacent. To assist in alignment and placement of the components of the cold plate 202, a guide marker may be placed at one or more location on the cold plate 202, such as guide marker 308 on the bottom component 304. In exemplary embodiments, the guide marker 308 is located near a plumbing port 306 to aid in orienting the top component relative 302 to the bottom component 304 when mating the top and bottom components 302 and 304. The guide marker 308 may be, for example, a hole, a raised element, or a printed indicator.

In exemplary embodiments, the cold plate 202 is placed atop a module 310, providing a heat transfer path to cool the module 310 for thermal stability of the module 310. The module 310 may include a variety of electronic components such as one or more microprocessors, memory, busses, and the like. In exemplary embodiments, the module 310 is a multi-chip module (MCM) with multiple chip subcomponents encapsulated in a single package. While the module 310 is depicted as a single package, it will be understood that the module 310 may also include multiple mechanical subcomponents which may be separable from the module 310, such as a lid, lateral supports, substrate material, and the like. The module 310 may utilize any packaging and interfacing technology known in the art, such as a PGA, BGA, LGA, or hybrid LGA module. The module 310 may make electrical contact with the PWB 102 via a socket 312. Although the socket 312 obstructs a direct view of the module 310 in FIG. 3a, the distinction between the socket 312 and the module 310 is apparent in FIG. 3b. In exemplary embodiments, the socket 312 acts as an interface between the module 310 and the PWB 102, and can vary in design based on the module technology. For example, the socket 312 may include two-sided spring or pad interfaces when the module 310 in an LGA, or one side of the socket 312 may include solder connections when the module 310 is a hybrid LGA. As the module 310 may require an actuation load to maintain electrical connections, the cold plate assembly 300 may further include one or more load arm 314 to hold the spring plate assembly 204 in place above the cold plate 202.

While the cold plate assembly 300 is depicted with two load arms 314, it will be understood that any number of load arms 314 with a variety of designs may be used within the scope of the invention (e.g., 1, 2, 4). For example, one or more of the load arms 314 could be designed as a post, a clip, or a hinge member. In exemplary embodiments, each load arm 314 is coupled to a hinge plate 316. Each hinge plate 316 may be attached to the PWB 102 using any fastening method known in the art (e.g., through-hole fasteners). In exemplary embodiments, the coupling of the load arm 314 to the hinge plate 316 provides a pivot point such that the load arm 314 can pivot outwardly, thus simplifying placement and removal of the cold plate 202 and the spring plate assembly 204 above the module 310.

In exemplary embodiments, the spring plate assembly 204 includes two spring plates 318 and an actuation screw 320. Actuation may be provided by fixed travel of the actuation screw 320 though the spring plates 318. While the exemplary spring plate assembly 204 includes a single actuation screw 320 and two spring plates 318, it will be understood that the scope of the invention is not so limited. To the contrary, there may be multiple screws, or similar coupling means, and any number of spring plates, laminated or otherwise, within embodiments of the present invention. For example, in applications that require an increased actuation load, additional spring plates 318 can be added to the spring plate assembly 204, while applications with a lower actuation load requirement may use a single spring plate 318. The spring plate assembly 204 may have vertical slots 322 at either end of the spring plate assembly 204. The vertical slots 322 allow for adjustment and travel of spring pins 324. The spring pins 324 may apply a force at each end of the spring plates 318. In exemplary embodiments, each spring pin 324 is located above an end of the spring plates 318, providing an attachment point for each load arm 314.

In exemplary embodiments, the module 310 is seated on the socket 312, the cold plate 202 is placed on top of the module 310, and the spring plate assembly 204 is placed on top of the cold plate 202. An actuation load may be applied to the cold plate 202 via the spring plate assembly 204. In exemplary embodiments, the actuation load is configured to mechanically actuate the cold plate 202 to the module 310. The load arms 314 can be locked down onto the spring pins 324 of the spring plate assembly 204, thus maintaining the actuation load on the cold plate 202. The actuation screw 320 may be adjusted to increase or decrease the actuation load. Although a range of actuation load forces may be applied, the actuation load force achieved through locking the spring plate assembly 204 on the cold plate 202 may be about 200 to about 300 lbs. The actuation load may be adjusted depending on the number of connections required between the module 310 and the socket 312. For example, if the module 310 is a hybrid LGA module, the required actuation load may be about 60 grams per electrical connection point. In exemplary embodiments, the actuation load maintains a thermal interface material gap thickness 326 of about 30 to about 50 microns between the bottom of the cold plate 202 and the top of the module 310. Moreover, the actuation load may be adjusted to account for varying height differences between modules 310, as different modules 310 are manufactured within a tolerance range, and the modules 310 may include chips or cores of varying heights. The actuation load may also be adjusted to account for additional forces imparted by plumbing lines, such as the plumbing lines 104 of FIG. 2, connected to the plumbing ports 306 when multiple cold plate assemblies are plumbed together, as depicted in the quadrant of cold plate assemblies 200 of FIG. 2.

Figure 3B:
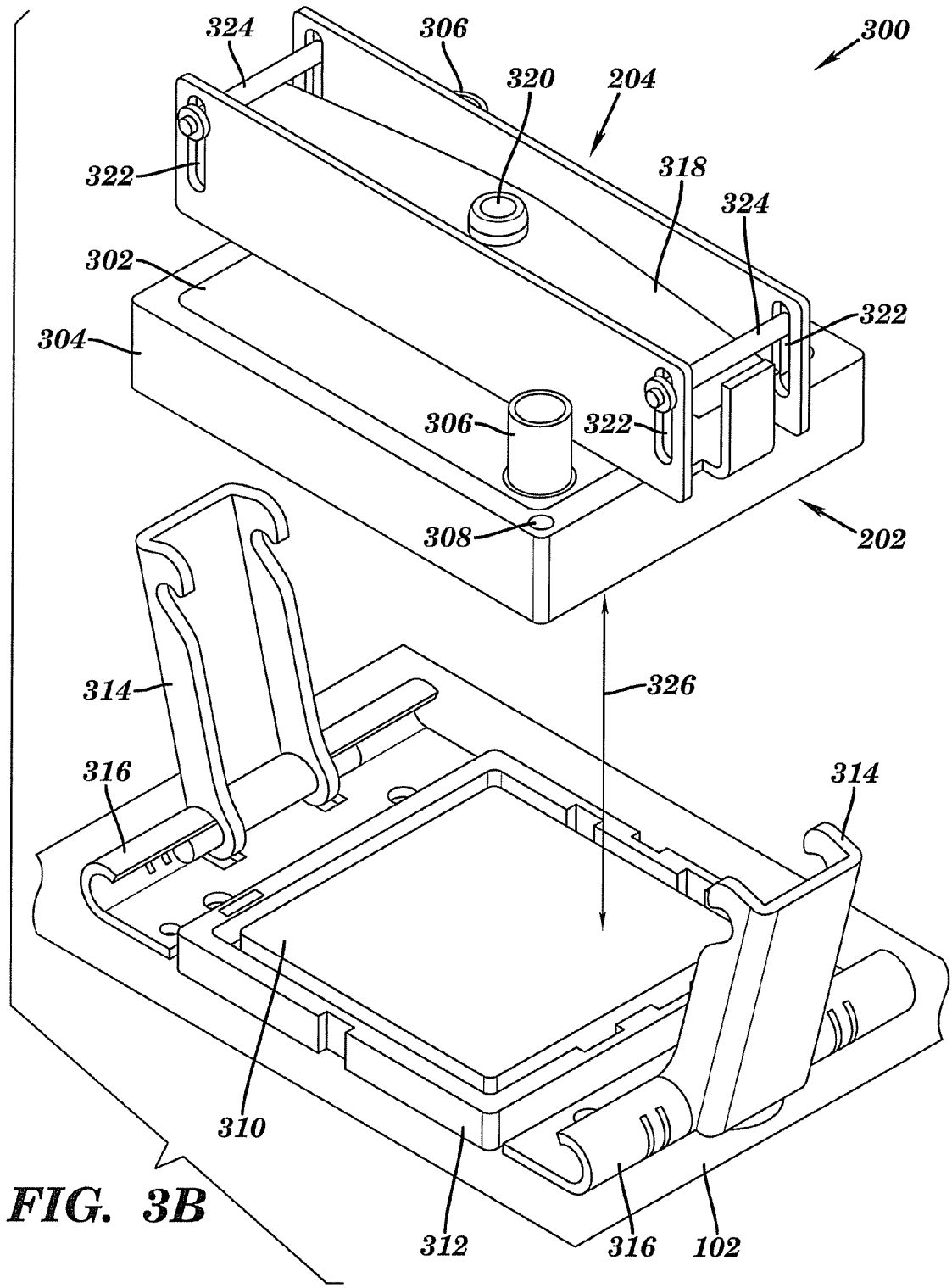
FIG. 3*b* is an exploded view of a cold plate assembly with load arms and a module subject to cooling in accordance with exemplary embodiments.

Turning now to FIG. 3b, an exploded view of the cold plate assembly 300 is depicted in accordance with exemplary embodiments. FIG. 3b provides an enhanced view of the cold plate 202 and the spring plate assembly 204 separated and raised above the module 310, making the thermal interface material gap thickness 326 more apparent. In exemplary embodiments, a thermal interface material, such as thermal grease, is placed or applied in the thermal interface material gap thickness 326, thus enhancing heat transfer between the cold plate 202 and the module 310. FIG. 3b further depicts the pivoting motion of the load arms 314 relative to the hinge plates 316, as the load arms 314 are pivoted outwardly to ease placement and removal of the cold plate 202 and the spring plate assembly 204 on the module 310.

Figure 4:
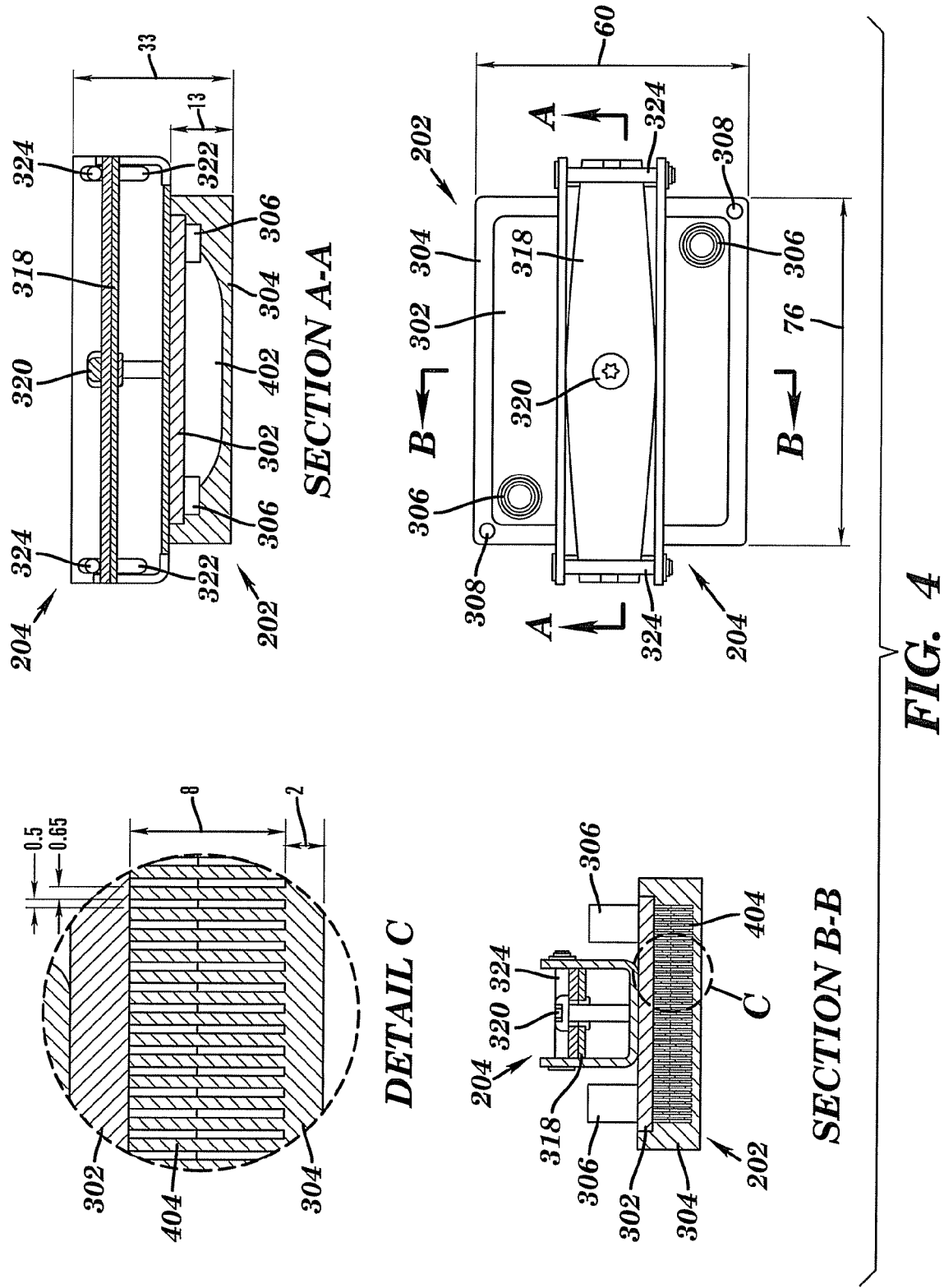
FIG. 4. includes a top view and side cross sectional views of the structure of a cold plate assembly in accordance with exemplary embodiments.

Turning now to FIG. 4, a top view and side cross sectional views of the structure of the cold plate 202 and the spring plate assembly 204 are depicted in accordance with exemplary embodiments. Sections A-A and B-B provide side cross-sectional views of the cold plate 202 and the spring plate assembly 204. In section A-A of FIG. 4, a cooling fluid reservoir 402 can be seen as gap between the top and bottom components 302 and 304 of the cooling plate 202. In exemplary embodiments, the plumbing ports 306 depicted in section A-A, are brazed to the bottom component 304 of the cold plate 202, providing structural stability while reducing the risk of leaks. The plumbing ports 306 may also be brazed or otherwise coupled to the top component 302 of the cold plate 202. Section A-A further depicts other details previously described, such as the structural relationship between components of the spring plate assembly 204.

Section B-B of FIG. 4 depicts cooling fins 404 that run through the cooling fluid reservoir 402. In exemplary embodiments, the cooling fins 404 are integral with the bottom component 304 of the cold plate 202, as depicted in detail C. The dimensioning depicted on various views in FIG. 4 is provided merely for purposes of example, and should not be viewed as limiting in scope, as the various components depicted can be scaled based upon a particular application (e.g., various module sizes, actuation load requirements, cooling fluid flow requirements, and the like). In exemplary embodiments, structural stability of the cold plate 202 is achieved through brazing the cooling fins 404 to the top component 302 of the cold plate 202. Brazing the cooling fins 404 may enable the cold plate 202 to withstand a high actuation load associated with various module designs, such as a hybrid LGA (e.g., actuation load of about 200 to about 300 lbs.), and thus providing cold plate stability. Brazing the cooling fins 404 to the top component 302 of the cold plate 202 may further enable center point actuation, providing a substantially uniform a thermal interface material gap thickness 326. Brazing the cooling fins 404 to the top component 302 of the cold plate 202 may further contribute to a low deformation rate of the cold plate 202 and the cold plate assembly 300, providing substantially uniform deformation, and thus making coupling of multiple assemblies possible, such as the quadrant of cold plate assemblies 200 of FIGS. 1 and 2. Moreover, brazing may also provide enhance durability and resistance to corrosive effects associated with long-term contact with a cooling fluid, such as water.

Figure 5:
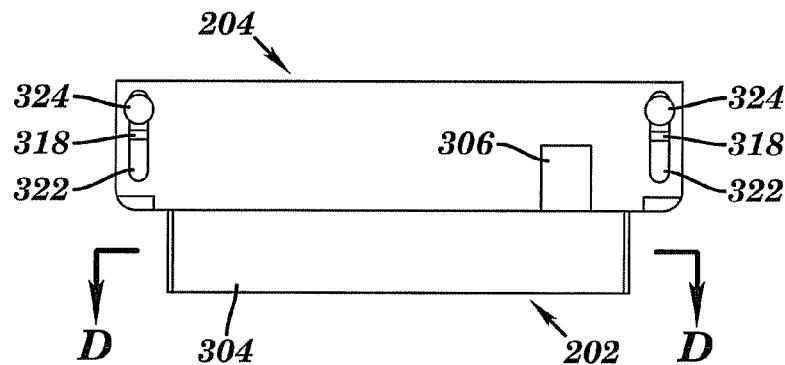
FIG. 5 is a top cross sectional view of the structure of a channel and manifold for a cold plate assembly in accordance with exemplary embodiments.
Figure 5:
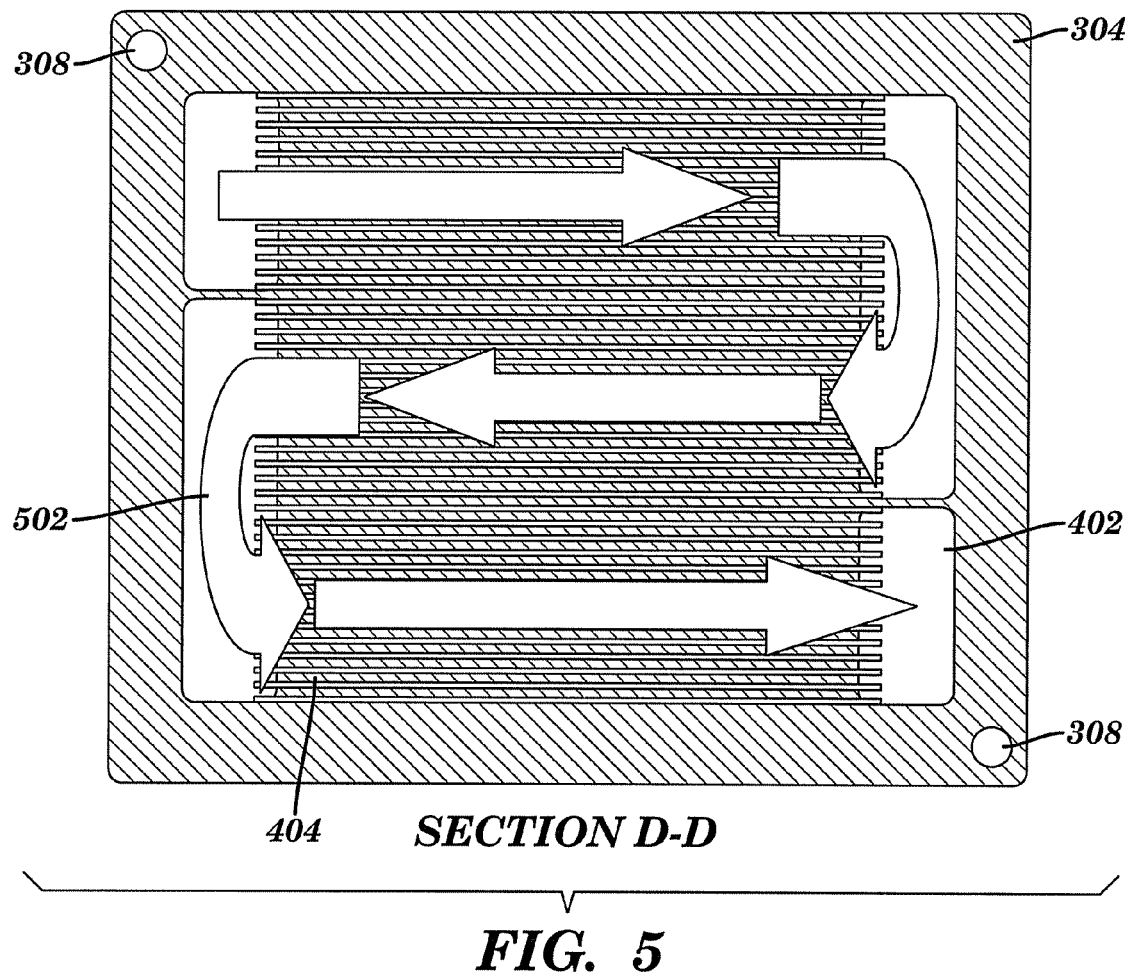

Turning now to FIG. 5, a top cross sectional view of the structure of a channel and manifold for a cold plate 202 is depicted in accordance with exemplary embodiments. Section D-D of FIG. 5 illustrates an exemplary cooling fluid circulation path 502 through the cooling fluid reservoir 402 and the cooling fins 404. The cooling fluid reservoir 402 may include all gap space in the bottom component 304 of the cooling plate 202, not otherwise occupied by the cooling fins 404 or the plumbing ports 306. In exemplary embodiments, the direction of flow and flow rate through the cooling fluid circulation path 502 can be adjusted by varying the inlet and outlet pressure at the plumbing ports 306. As previously described, the approximate location of the plumbing ports 306 may be identified as the corner nearest to the guide markers 308.

Figure 6:
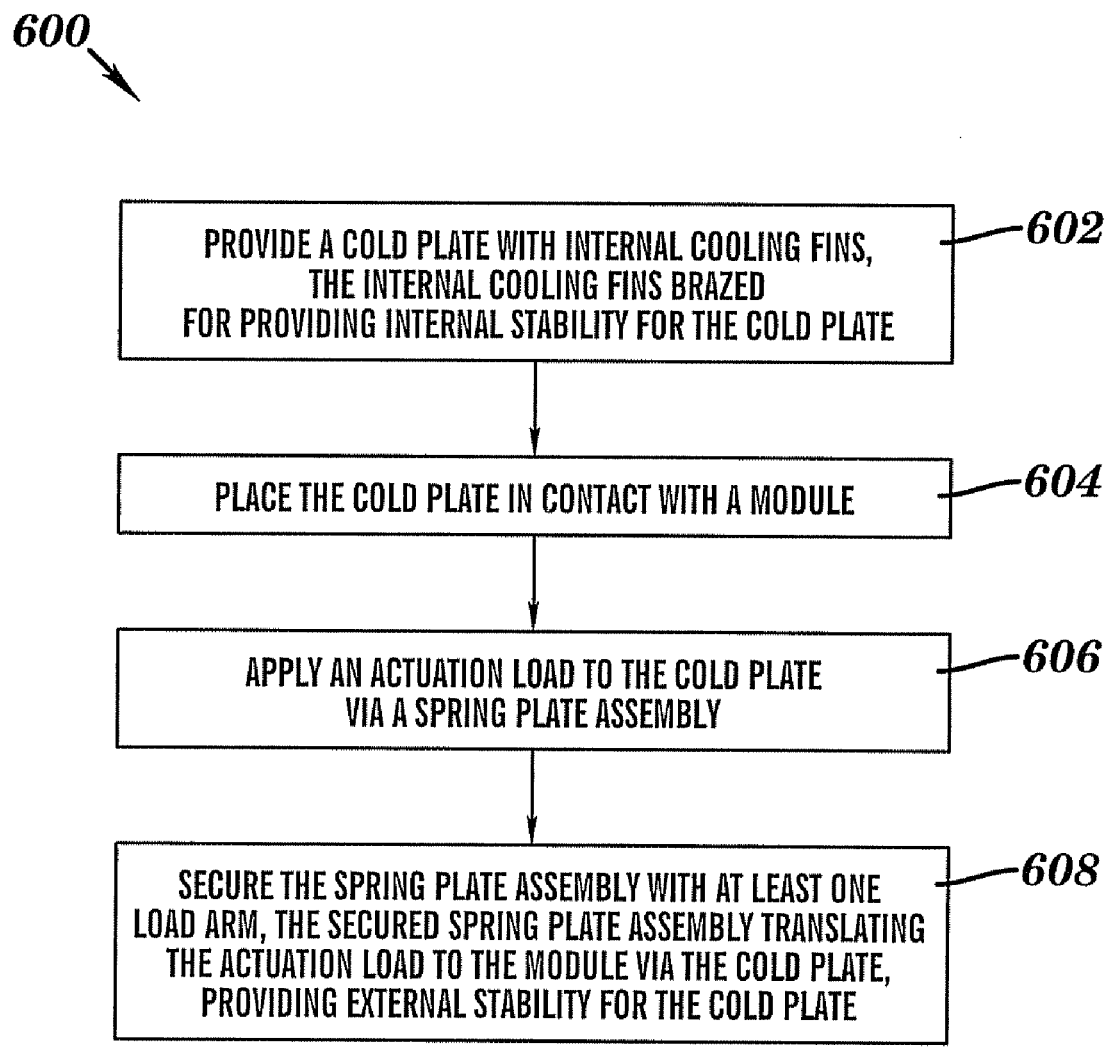
FIG. 6 is a flow diagram describing a process for providing cold plate stability in accordance with exemplary embodiments.

Turing now to FIG. 6, a flow diagram describing a process 600 for providing cold plate stability is depicted in accordance with exemplary embodiments. For ease of explanation, the process 600 is described in reference to the cold plate assembly 300, with the cold plate 202 and spring plate assembly 204 as depicted in FIGS. 2-5; however, the process 600 is not so limited to the depicted embodiments. In exemplary embodiments, the cold plate 202 includes at least two plumbing ports 306, providing an inlet and an outlet for a cooling fluid. The cold plate 202 may further include the top component 302 and the bottom component 304. At block 602, the cold plate 202 includes cooling fins 404 internal to the cold plate 202, the cooling fins 404 brazed for providing internal stability for the cold plate 202. The cooling fins 404 may be integral to the top or bottom component 302 and 304 of the cold plate 202, with brazing applied between the cooling fins 404 and the non-integral component, e.g., the cooling fins 404 may be cast as features of the bottom component 304 and brazed to the top component 302 for enhanced internal structural stability of the cold plate 202. In exemplary embodiments, the cooling fins 404 provide a cooling fluid circulation path 502 between the at least two plumbing ports 306. The cooling fluid reservoir 402 may also be part of the cooling fluid circulation path through the bottom component 304 of the cold plate 202.

At block 604, the cold plate 202 is placed in contact with the module 310. As previously described, the module 310 may utilize any packaging and interfacing technology known in the art, such as a PGA, BGA, LGA or hybrid LGA module. In exemplary embodiments, the module 310 interfaces with the socket 312, which is positioned on the PWB 102. A thermal interface material, such as thermal grease, may be applied to the top of the module 310 or the bottom of the cold plate 202 to enhance heat transfer through the thermal interface material gap thickness 326.

At block 606, an actuation load is applied to the cold plate 202 via the spring plate assembly 204. In exemplary embodiments, the spring plate assembly 204 includes at least one spring plate 318 and actuation screw 320, the actuation screw 320 adjustable to set the actuation load. The actuation load may also be influenced by the spring pins 324 and the movement of the spring pins 324 within the vertical slots 322. In exemplary embodiments, the actuation load is centrally applied relative to the cold plate 202 with internally brazed cooling fins, establishing a substantially uniform thermal interface material gap thickness 326.

At block 608, the spring plate assembly 204 is secured with at least one load arm 314. In exemplary embodiments, the at least one load arm 314 is secured to the PWB 102 via a hinge plate 316. The secured spring plate assembly 204 translates the actuation load to the module 310 via the cold plate 202, providing external stability for the cold plate 202. The process 600 may further include connecting a plumbing line 104 between one of the at least two plumbing ports 306 and a plumbing port 306 of a second cold plate 202, forming an interconnected assembly, such as that depicted in the quadrant of cold plate assemblies 200 of FIG. 2.

Technical effects of exemplary embodiments of the invention may include applying an actuation load to maintain electrically connectivity to a module, such as a hybrid LGA module, while providing fluid cooling. Further technical effects include support for multiple assemblies plumbed together, providing a scaleable solution for varying application scope. The use of brazing on internal cooling fins within a cold plate may provide substantially low and uniform deformation through enhanced structural stability, while enabling the cold plate to withstand high actuation loads.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item

What is claimed is:

1. A cold plate assembly, comprising:
   a cold plate with at least two plumbing ports; and
   a spring plate assembly which applies an actuation load to the cold plate, the actuation load configured to mechanically actuate the cold plate to a module, the spring plate assembly comprising a spring plate and a spring pin moveable in a slot of the spring plate assembly to maintain the actuation load.

2. The cold plate assembly of claim 1 further comprising:
   at least one load arm which locks the spring plate assembly onto the cold plate via coupling the at least one load arm to the spring pin.

3. The cold plate assembly of claim 1 wherein the cold plate includes cooling fins within the cold plate, the cooling fins providing a cooling fluid circulation path between the at least two plumbing ports.

4. The cold plate assembly of claim 3 wherein the cold plate further comprises a top component and a bottom component.

5. The cold plate assembly of claim 4 wherein the cooling fins are brazed to the top component.

6. The cold plate assembly of claim 4 wherein the bottom component includes the cooling fins and a cooling fluid reservoir.

7. The cold plate assembly of claim 1 wherein the spring plate assembly includes a second spring plate and an actuation screw, the actuation screw adjustable to set the actuation load.

8. The cold plate assembly of claim 2 wherein the at least one load arm is coupled to a hinge plate, the hinge plate providing a pivot point to pivot the at least one load arm to place and remove the cold plate and the spring plate assembly in relation to the module.

9. The cold plate assembly of claim 1 wherein a thermal interface material gap thickness is established between the cold plate and the module.

10. A cold plate assembly comprising:
    a cold plate with at least two plumbing ports, the cold plate comprising:
      a top component coupled to a bottom component; and
      cooling fins brazed to at least one of the top component and the bottom component, wherein the cooling fins provide a cooling fluid circulation path between the at least two plumbing ports;
    a spring plate assembly which applies an actuation load to the cold plate, the spring plate assembly comprising at least one spring plate, at least one spring pin, and an actuation screw, the actuation screw adjustable to set the actuation load; and
    at least one load arm which locks the spring plate assembly onto the cold plate via the at least one spring pin of the spring plate assembly and maintains the actuation load.

* * * * *